United States Patent
Simoens et al.

(10) Patent No.: US 11,083,120 B2
(45) Date of Patent: Aug. 3, 2021

(54) BRAIDED ELECTROMAGNETIC INTERFERENCE PROTECTIVE SLEEVE AND METHOD OF CONSTRUCTION THEREOF

(71) Applicant: Federal-Mogul Powertrain, LLC, Southfield, MI (US)

(72) Inventors: Amelie Simoens, Compiegne (FR); Benoit Laurent, Trosly-Breuil (FR)

(73) Assignee: Federal-Mogul Powertrain LLC, Southfield, MI (US)

( * ) Notice: Subject to any disclaimer, the term of this patent is extended or adjusted under 35 U.S.C. 154(b) by 555 days.

(21) Appl. No.: 15/884,174

(22) Filed: Jan. 30, 2018

(65) Prior Publication Data
US 2018/0220558 A1    Aug. 2, 2018

Related U.S. Application Data

(60) Provisional application No. 62/452,681, filed on Jan. 31, 2017.

(51) Int. Cl.
*H05K 9/00*    (2006.01)
*D04C 1/08*    (2006.01)

(52) U.S. Cl.
CPC ............... *H05K 9/009* (2013.01); *D04C 1/08* (2013.01); *H05K 9/0098* (2013.01); *D10B 2401/16* (2013.01); *D10B 2505/00* (2013.01); *D10B 2505/12* (2013.01)

(58) Field of Classification Search
CPC ......... D04C 1/08; H05K 9/009; H05K 9/0098
See application file for complete search history.

(56) References Cited

U.S. PATENT DOCUMENTS

| | | | |
|---|---|---|---|
| 4,684,762 A | 8/1987 | Gladfelter | |
| 5,866,216 A * | 2/1999 | Flasher | D04C 1/02 428/36.1 |
| 6,738,265 B1 * | 5/2004 | Svarfvar | D04C 1/06 174/358 |
| 9,307,685 B2 | 4/2016 | Harris et al. | |
| 10,167,581 B2 * | 1/2019 | Fathallah | B29C 35/02 |

(Continued)

FOREIGN PATENT DOCUMENTS

| | | |
|---|---|---|
| EP | 2312192 A1 | 4/2011 |
| WO | 2013047897 A1 | 4/2013 |
| WO | 2016010730 A1 | 1/2016 |

OTHER PUBLICATIONS

International Search Report, dated May 15, 2018 (PCT/US2018/016059).

*Primary Examiner* — Shaun R Hurley
(74) *Attorney, Agent, or Firm* — Robert L. Stearns; Dickinson Wright, PLLC

(57) ABSTRACT

A braided EMI protective sleeve and method of construction thereof is provided. The sleeve has a braided, tubular wall extending lengthwise along a central longitudinal axis between open opposite ends. The wall includes a plurality of filament bundles, with each filament bundle including a plurality of filaments twisted with one another to form a plurality of loops, wherein a plurality of the loops of each filament bundle are interlinked with a plurality of the loops of an adjacent filament bundle. At least some of the filament bundles include a conductive wire filament to provide the sleeve with an EMI protective shielding capacity.

4 Claims, 8 Drawing Sheets

(56) References Cited

U.S. PATENT DOCUMENTS

| | | | |
|---|---|---|---|
| 10,202,714 B2* | 2/2019 | Fathallah | ............... B29B 11/04 |
| 2003/0089971 A1 | 5/2003 | Akers et al. | |
| 2010/0084179 A1* | 4/2010 | Harris | ............... H02G 3/0481 |
| | | | 174/350 |
| 2014/0202762 A1 | 7/2014 | Adachi et al. | |
| 2016/0021799 A1 | 1/2016 | Harris et al. | |
| 2016/0122915 A1 | 5/2016 | Fathallah et al. | |
| 2016/0122916 A1 | 5/2016 | Fathallah et al. | |
| 2016/0153591 A1 | 6/2016 | Fonfara et al. | |
| 2016/0201232 A1 | 7/2016 | Harris et al. | |
| 2016/0245432 A1 | 8/2016 | Fonfara et al. | |
| 2016/0258559 A1 | 9/2016 | Rooke et al. | |
| 2017/0121868 A1* | 5/2017 | Zhang | ............... D03D 1/0041 |

\* cited by examiner

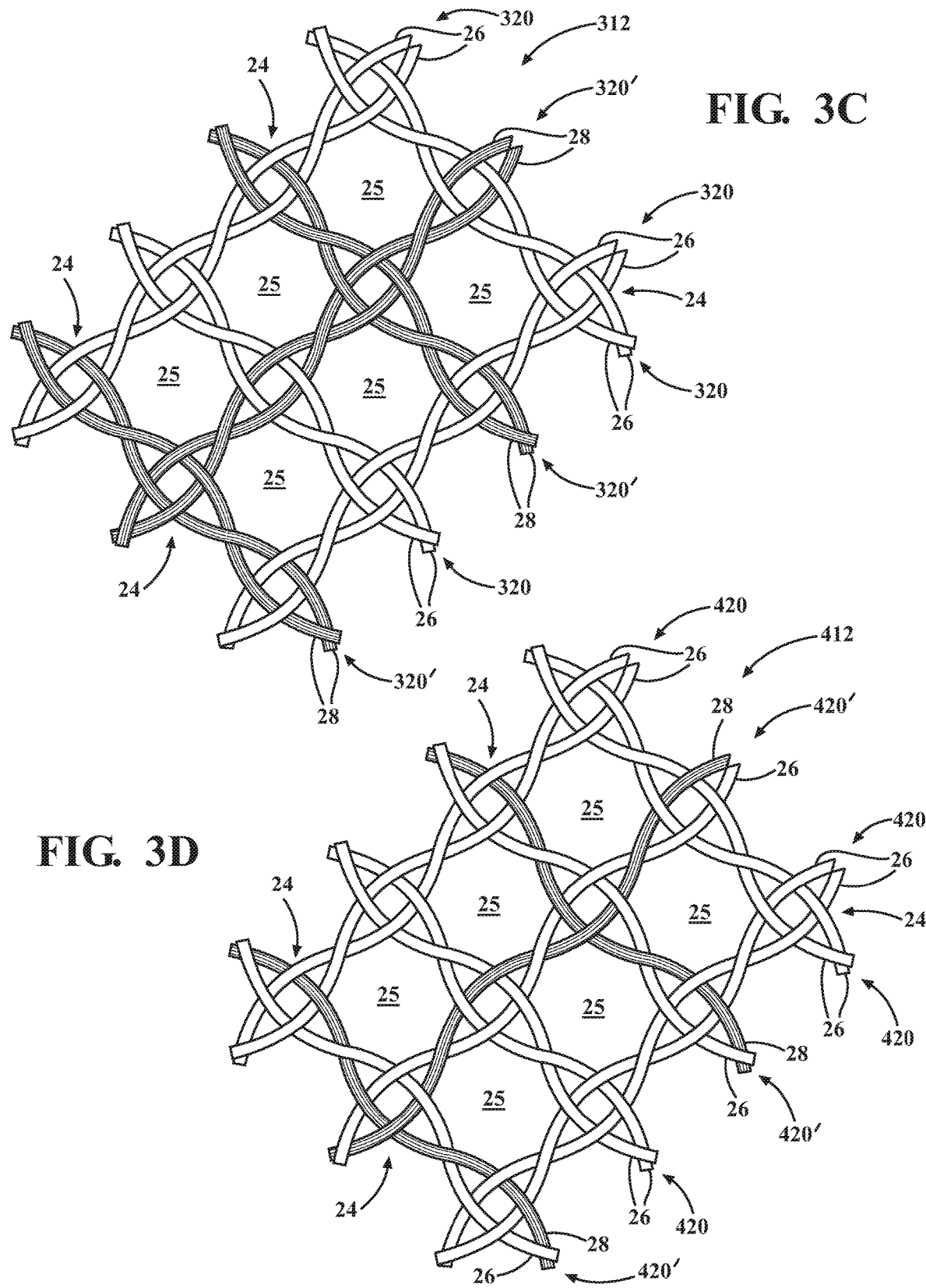

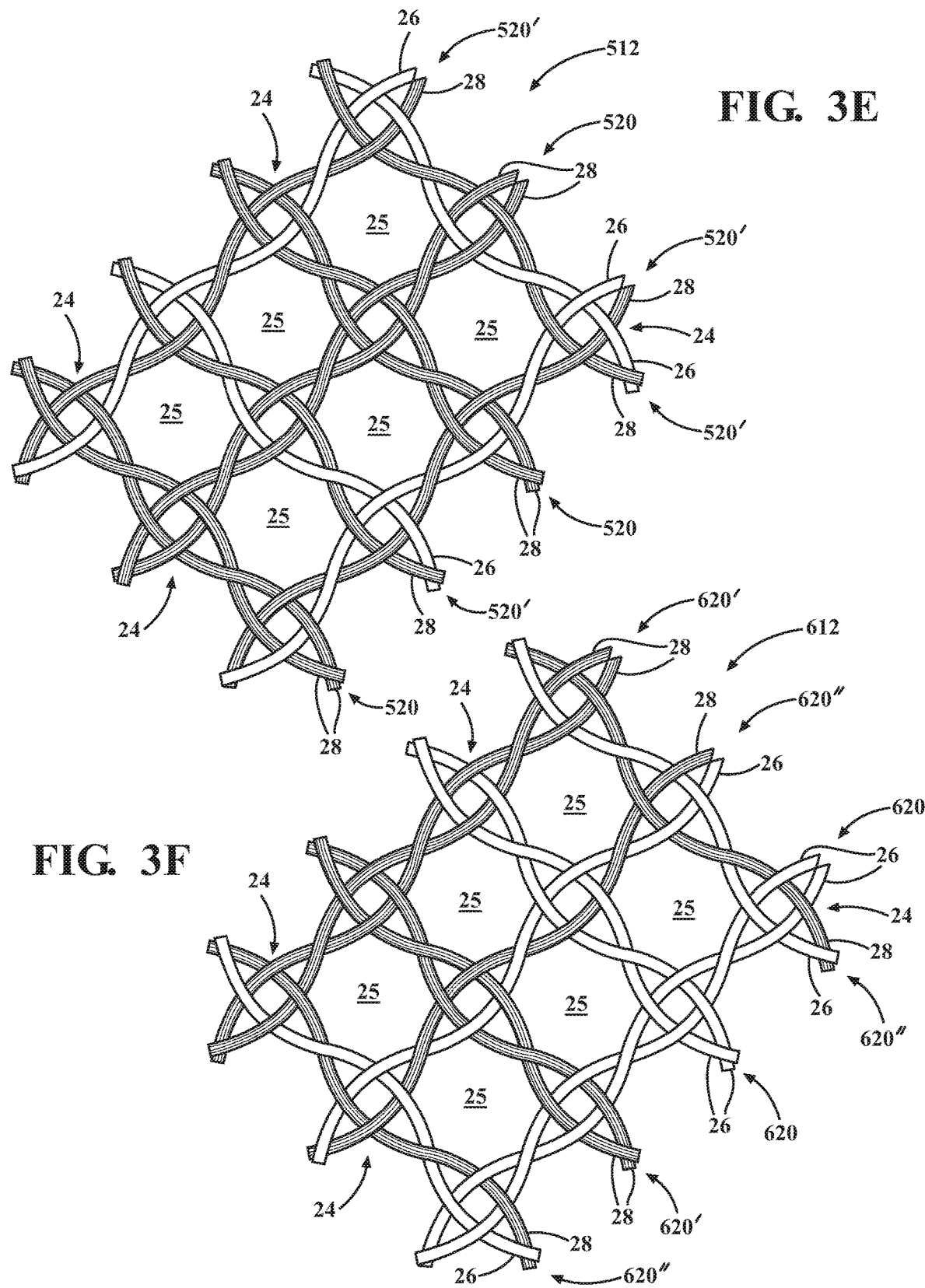

BRAIDED ELECTROMAGNETIC INTERFERENCE PROTECTIVE SLEEVE AND METHOD OF CONSTRUCTION THEREOF

CROSS-REFERENCE TO RELATED APPLICATION

This application claims the benefit of U.S. Provisional Application Ser. No. 62/452,681, filed Jan. 31, 2017, which is incorporated herein by reference in its entirety.

BACKGROUND OF THE INVENTION

1. Technical Field

This invention relates generally to textile sleeves, and more particularly to braided electromagnetic interference protective sleeves.

2. Related Art

It is known that electrical members, such as electrical cables, need to be protected against electromagnetic interference (EMI) to prevent the performance of electrical components attached thereto from being adversely affected. In some cases, each separate cable of a wire harness bundle can be shielded with a protective sleeve in an effort to reduce EMI, thereby resulting in as many protective sleeves as there are cables, and in other cases, the separate cables of the wire harness bundle can remain unshielded, and a single protective sleeve can be used to shield the entirety of the separate cables. In the former case, although generally successful in shielding the individual cables, increased cost, mass and space requirements results due to the presence of the separate protective sleeves. In the latter case, problems can arise due to having to conform a single protective sleeve about the ends of each of the bundled cables, particularly when the ends are required to flair or fan outwardly for attachment to an electrical connector or backshell. In order for the protective sleeve to expand from a relatively reduced diameter immediately adjacent the ends of the separate cables to an enlarged, fanned-out shape for connection to the electrical connector, the size of known protective sleeves is provided having a minimum diameter that is considered too large for the bundled cables in order to allow the end that needs to be fanned-out and enlarged to attain the size needed to allow for connection of the cables to their respective electrical connector. As such, known protective sleeves are typically unable to conform tightly over the entire length of the bundled cables, thereby adding bulk, mass and cost to the shielded, bundled cable assembly.

An EMI braided sleeve constructed in accordance with the invention overcomes at least those drawbacks discussed above, as will be readily understood by one possessing ordinary skill in the art upon viewing the disclosure herein.

SUMMARY OF THE INVENTION

In accordance with one aspect of the invention, a braided EMI protective sleeve is provided. The sleeve has a braided, tubular wall extending lengthwise along a central longitudinal axis between open opposite ends. The wall includes a plurality of filament bundles, with each filament bundle including a plurality of filaments twisted with one another to form a plurality of loops, wherein a plurality of the loops of each filament bundle are interlinked with a plurality of the loops of an adjacent filament bundle. A plurality of the filaments are provided as conductive wire filaments to provide the sleeve with an EMI protective capability.

In accordance with another aspect of the invention, a plurality of the filament bundles can be formed entirely of conductive wire filaments.

In accordance with another aspect of the invention, the entirety of the filament bundles can be formed entirely of conductive wire filaments.

In accordance with another aspect of the invention, the wall can be formed entirely of the filament bundles, with the entirety of the filament bundles being formed entirely of conductive wire filaments.

In accordance with another aspect of the invention, at least some of the filament bundles can include nonconductive filaments.

In accordance with another aspect of the invention, at least some of the filament bundles can be formed entirely of nonconductive filaments.

In accordance with another aspect of the invention, at least some of the filament bundles can include nonconductive filaments twisted with conductive wire filaments.

In accordance with another aspect of the invention, at least some of the filament bundles can include a nonconductive multifilament yarn twisted or served with the conductive wire filaments, thereby enhancing the coverage protection and impact resistance of the wall.

In accordance with another aspect of the invention, a method of constructing an EMI protective sleeve is provided. The method includes braiding a tubular wall extending lengthwise along a central longitudinal axis between open opposite ends. Further, braiding the wall including a plurality of filament bundles, and providing each filament bundle including a plurality of filaments twisted with one another to form a plurality of loops along the length of the respective filament bundle. Further yet, interlinking a plurality of the loops along the length of each filament bundle with a plurality of loops of an adjacent filament bundle and providing a plurality of the filaments as conductive wire filaments to provide the sleeve with an EMI protective capability.

In accordance with another aspect of the invention, the method can further include providing a plurality of the filament bundles being formed entirely of conductive wire filaments twisted with one another.

In accordance with another aspect of the invention, the method can further include providing the entirety of the braided filament bundles being formed entirely of conductive wire filaments.

In accordance with another aspect of the invention, the method can further include braiding the wall entirely of conductive wire filaments.

In accordance with another aspect of the invention, the method can further include providing at least some of the filament bundles including nonconductive filaments.

In accordance with another aspect of the invention, the method can further include providing at least some of the filament bundles being formed entirely of nonconductive filaments twisted with one another.

In accordance with another aspect of the invention, the method can further include providing at least some of the filament bundles including nonconductive filaments and conductive filaments twisted with one another.

In accordance with another aspect of the invention, the method can further include providing at least some of the filament bundles as hybrid filament bundles including a hybrid filament having a conductive wire filament twisted or served with a nonconductive filament, with the hybrid filament being twisted with another filament to form the hybrid filament bundle.

BRIEF DESCRIPTION OF THE DRAWINGS

These and other aspects, features and advantages of the present invention will become more readily appreciated when considered in connection with the following detailed description of presently preferred embodiments and best mode, appended claims and accompanying drawings, in which:

FIG. 3C is a partial plan view of a wall of a sleeve including filaments in accordance with yet another aspect of the disclosure;

FIG. 3D is a partial plan view of a wall of a sleeve including filaments in accordance with yet another aspect of the disclosure;

FIG. 3E is a partial plan view of a wall of a sleeve including filaments in accordance with yet another aspect of the disclosure;

FIG. 3F is a partial plan view of a wall of a sleeve including filaments in accordance with yet another aspect of the disclosure;

DETAILED DESCRIPTION OF PRESENTLY PREFERRED EMBODIMENTS

Figure 1:
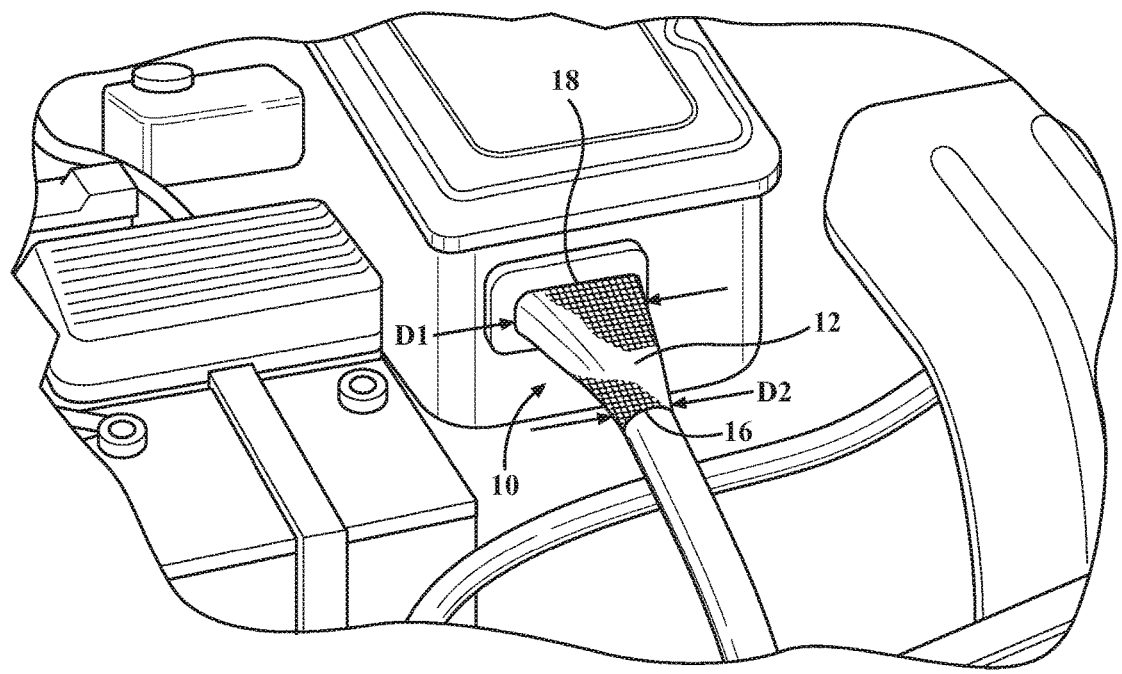
FIG. 1 is a perspective view of a high power cable bundle connected to an electrical vehicle component with a braided EMI protective sleeve constructed in accordance with one embodiment of the disclosure shown disposed about flared end regions of a plurality of electrical cables.
Figure 2:
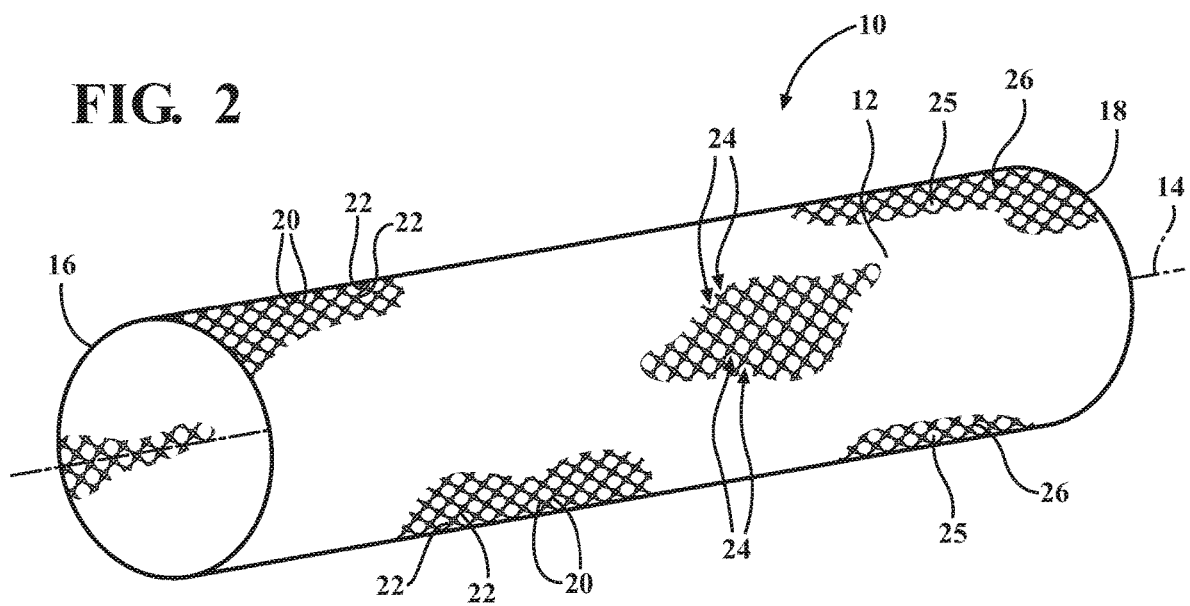
FIG. 2 is side view of the sleeve of FIG. 1.

Referring in more detail to the drawings, FIGS. 1 and 2 illustrate a braided protective sleeve, referred to hereafter as sleeve 10, constructed in accordance with one aspect of the invention. The sleeve 10 has a braided, circumferentially continuous, seamless tubular wall 12 extending lengthwise along a central longitudinal axis 14 between opposite open ends 16, 18. The wall 12 is axially compressible along the entirety of its length to attain an increased diameter D1, in any desired location along the length of the sleeve 10, and is axially extendible to attain a decreased diameter D2, in any desired location along the length of the sleeve 10. Accordingly an increased diameter region(s) D1 and decreased diameter region(s) D2 can be formed anywhere along the length of the sleeve 10, as desired, such as may prove necessary to accommodate enlarged regions, such as may be present in areas of connectors or the like, and to conform the sleeve 10 in a snug fit about the member(s) being protected thereby.

The wall 12 includes a plurality of filament bundles 20, with each filament bundle 20 including a plurality of ends of filaments 22, shown as a pair of filaments 22, by way of example and without limitation, twisted with one another. The term filament, as used herein, is intended to include both monofilaments and multifilaments, and can also be referred to commonly as yarn, whether a monofilament or multifilament. Accordingly, a filament bundle 20 can include both a monofilament(s) and a multifilament(s) or be formed entirely of monofilaments or entirely of multifilaments. A plurality of loops 24 are provided along the length of each filament bundle 20, wherein the loops 24 form enclosed openings between separate filaments 22 twisted with one another. At least some or all of the loops 24 of one filament bundle 20 are interlinked with at least some of all of loops 24 of an adjacent filament bundle 20, thereby serving to prevent the interlinked filament bundles 20 from shifting significantly relative to one another, thereby adding structural integrity to the sleeve 10. A plurality of the filaments 22 within the braided wall 12, and within at least some of the bundles 20, are provided as continuous conductive wire filaments 26 to provide the sleeve 10 with an EMI protective capability. With the bundles 20 being fixed against relative sliding and shifting movement with one another, as discussed above, an important further function is provided by maintaining openings 25 bounded between the braided bundles 20 as having a relatively fixed, predefined size, wherein the size of the openings 25 are predefined to optimize protection against EMI. Stated another way, if the conductive wire filaments 26 within the bundles 20 were free to shift and slide relative to one another, the openings 25 would be able to freely change and increase in size, particularly in areas being handled and manipulated, such as being expanded or fanned-out to fit over a connector, by way of example, and the EMI protection capacity of the wall 12 would be compromised, which, as a result of the interlinked loops 24 is not allowed to occur in a sleeve 10 constructed in accordance with the invention.

The filament bundles 20 can be formed having a multitude of configurations, depending on the nature of protection desired, including, by way of example and without limitation, protection against EMI, abrasion, ingress of contamination (fluid and debris), environmental thermal conditions, and further depending on the flexibility of the sleeve desired.

Figure 3A:
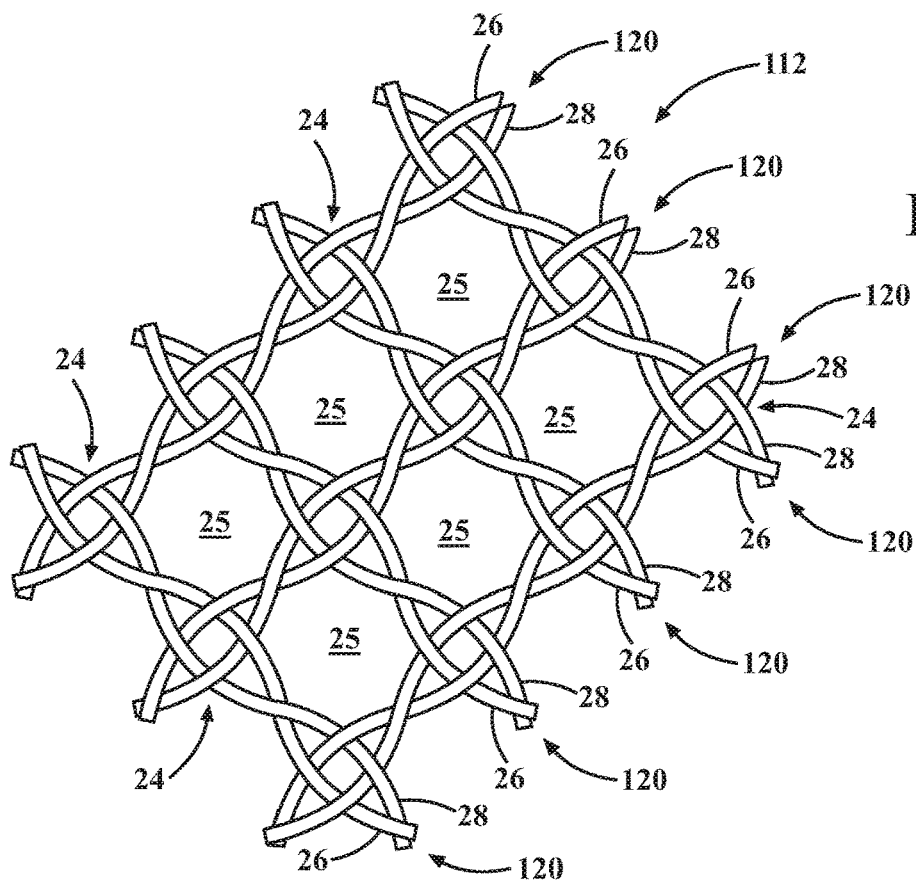
FIG. 3A is a partial plan view of a wall of a sleeve including filaments in accordance with another aspect of the disclosure.

For example, as shown in a non-limiting embodiment of FIG. 3A, filament bundles 120 forming a braided, tubular wall 112 constructed in accordance with one aspect of the disclosure, wherein the same reference numerals as used above, offset by a factor of 100, are used to identify like features, can be formed entirely of the conductive wire filaments 26. Thus, it is contemplated that the wall 112 can be formed entirely of conductive wire filaments 26, thereby maximizing the protection against EMI. However, it is contemplated that the filament bundles 20 and/or wall 12 could include nonconductive filaments 28 in addition to conductive wire filaments 26, such as to enhance protection against abrasion, against the ingress of contamination (fluid and debris), against environmental thermal conditions, to provide an increased elastic push-back force to enhance the automatic push-back (return) of the wall to an extended length upon be axially compressed, and to enhance the flexibility of the sleeve, by way of example and without limitation, while at the same time providing suitable protection against EMI, as discussed with regard to further non-limiting embodiments hereafter.

Figure 3B:
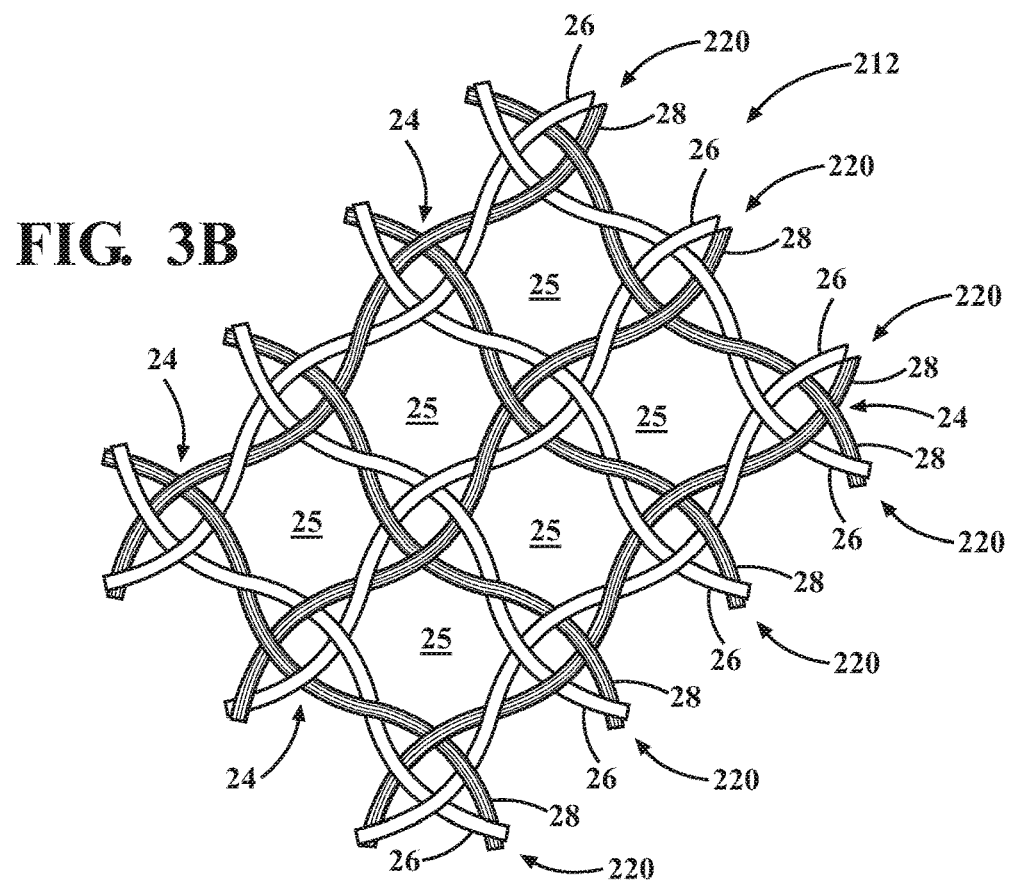
FIG. 3B is a partial plan view of a wall of a sleeve including filaments in accordance with yet another aspect of the disclosure.

In accordance with another non-limiting aspect of the disclosure, as shown in FIG. 3B, a braided, tubular wall 212, wherein the same reference numerals as used above, offset by a factor of 200, are used to identify like features, can include filament bundles 220 including both conductive wire filaments 26 and nonconductive filaments 28 twisted with one another. Accordingly, it is to be recognized that each filament bundle 220 can include one or more conductive wire filaments 26 twisted with one or more nonconductive filaments 28.

In accordance with another non-limiting aspect of the disclosure, as shown in FIG. 3C, a braided, tubular wall 312, wherein the same reference numerals as used above, offset by a factor of 300, are used to identify like features, can include filament bundles 320 including solely conductive wire filaments 26 twisted with one another and filament bundles 320' including solely nonconductive filaments 28 twisted with one another. It is to be recognized that the respective filament bundles 320, 320' can be alternated with one another, as desired, to attain the desired type of protection. Accordingly, the filament bundles 320, 320' can be braided with one another in equal numbers of ends and in uniform spacing with one another, whether alternating in 1:1 relation along opposite helical directions or otherwise. Of course, the filament bundles 320, 320' can be braided in unequal numbers of ends with one another, wherein more or fewer of one of the filament bundles 320, 320' can be braided with the other.

In accordance with another non-limiting aspect of the disclosure, as shown in FIG. 3D, a braided, tubular wall 412, wherein the same reference numerals as used above, offset by a factor of 400, are used to identify like features, can include a combination of filament bundles 420 including solely conductive wire filaments 26 twisted with one another and filament bundles 420' including conductive wire filaments 26 twisted with nonconductive filaments 28. It is to be recognized that the respective filament bundles 420, 420' can be alternated with one another, as desired, to attain the desired type of protection. Accordingly, the filament bundles 420, 420' can be braided with one another in equal numbers of ends and in uniform spacing with one another, whether alternating in 1:1 relation along opposite helical directions or otherwise. Of course, the filament bundles 420, 420' can be braided in unequal numbers of ends with one another, wherein more or fewer of one of the filament bundles 420, 420' can be braided with the other.

In accordance with another non-limiting aspect of the disclosure, as shown in FIG. 3E, a braided, tubular wall 512, wherein the same reference numerals as used above, offset by a factor of 500, are used to identify like features, can include a combination of filament bundles 520 including solely nonconductive wire filaments 28 twisted with one another and filament bundles 520' including conductive wire filaments 26 twisted with nonconductive filaments 28. It is to be recognized that the respective filament bundles 520, 520' can be alternated with one another, as desired, to attain the desired type of protection. Accordingly, the filament bundles 520, 520' can be braided with one another in equal numbers of ends and in uniform spacing with one another, whether alternating in 1:1 relation along opposite helical directions or otherwise. Of course, the filament bundles 520, 520' can be braided in unequal numbers of ends with one another, wherein more or fewer of one of the filament bundles 520, 520' can be braided with the other.

In accordance with another non-limiting aspect of the disclosure, as shown in FIG. 3F, a braided, tubular wall 612, wherein the same reference numerals as used above, offset by a factor of 600, are used to identify like features, can include a combination of filament bundles 620 including solely conductive wire filaments 26 twisted with one another; filament bundles 620' including solely nonconductive wire filaments 28 twisted with one another, and filament bundles 620" including conductive wire filaments 26 twisted with nonconductive filaments 28. It is to be recognized that the respective filament bundles 620, 620', 620" can be alternated with one another, as desired, to attain the desired type of protection. Accordingly, the filament bundles 620, 620', 620" can be braided with one another in equal numbers of ends and in uniform spacing with one another, whether alternating in 1:1:1 relation along opposite helical directions or otherwise. Of course, the filament bundles 620, 620', 620" can be braided in unequal numbers of ends with one another, wherein more or fewer of one of the filament bundles 620, 620', 620" can be braided with the others.

Figure 4:
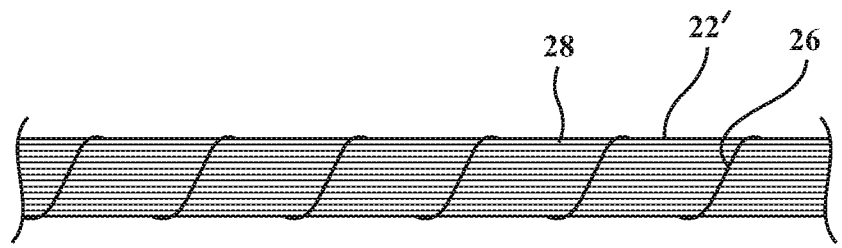
FIG. 4 is a partial side view of a hybrid filament that can be used in the construction of a wall of a sleeve in accordance with yet another aspect of the disclosure.
Figure 5A:
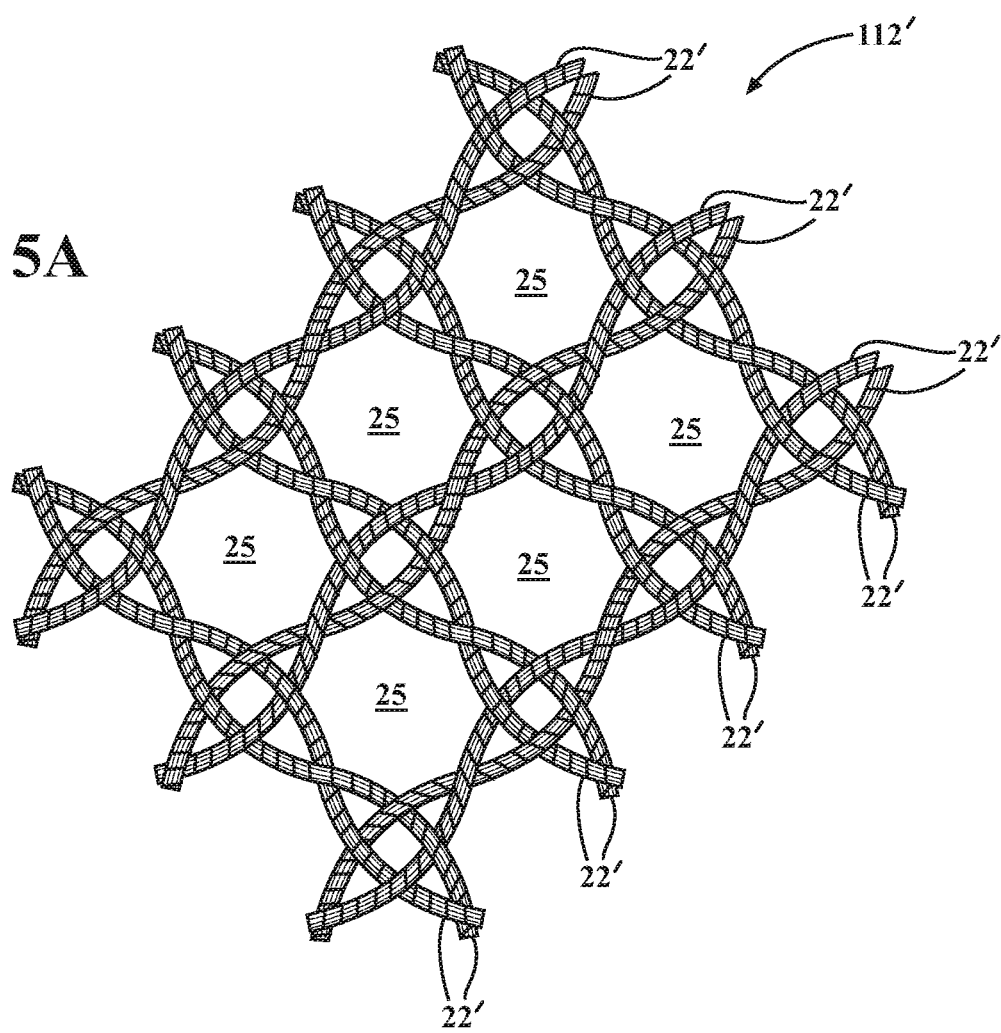
FIGS. 5A-5F illustrate partial plan views of tubular walls of different sleeves including the hybrid filament of FIG. 4.
Figure 5B:
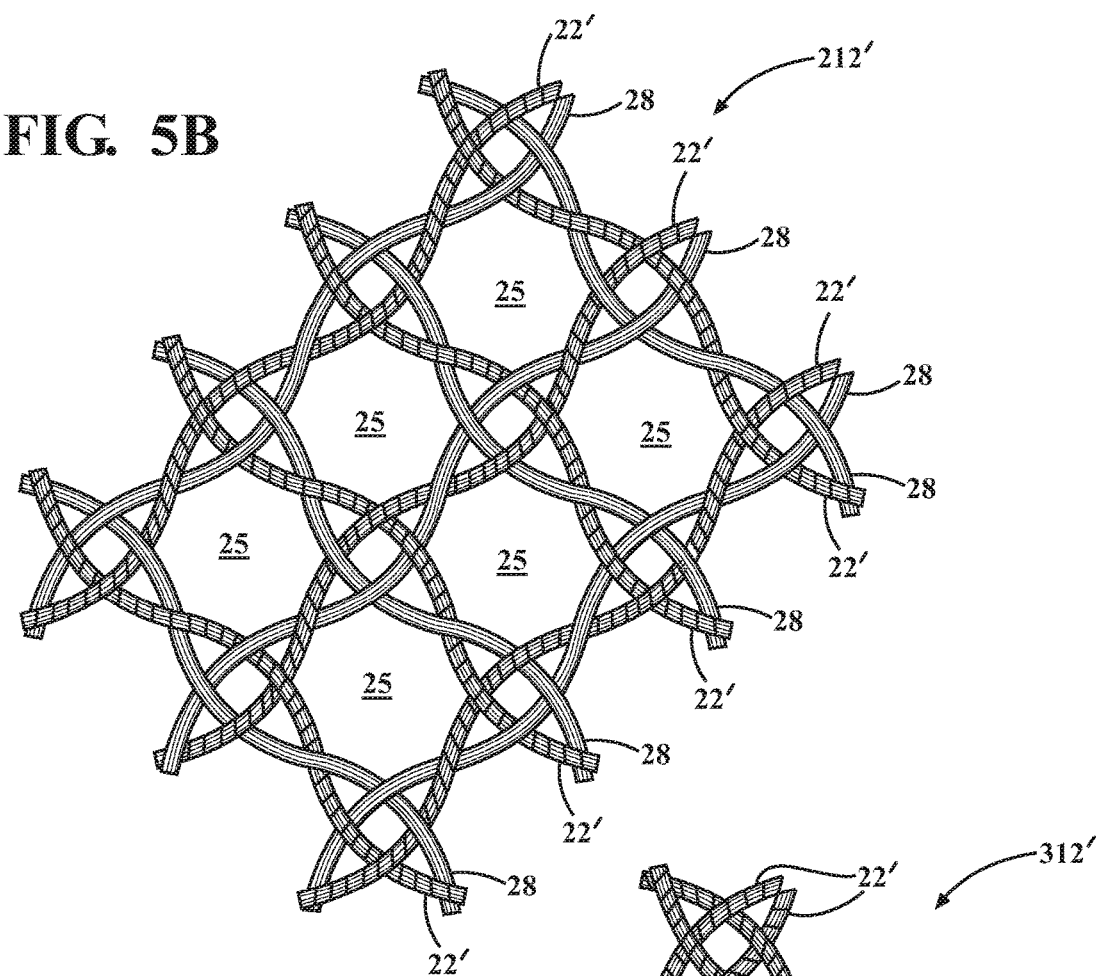
Figure 5C:
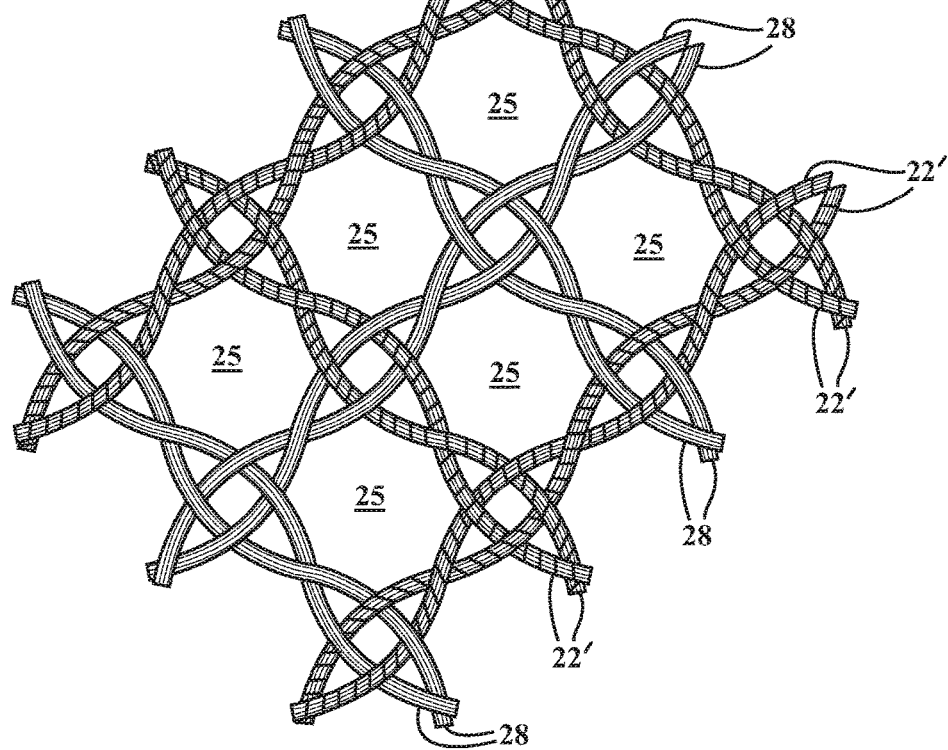
Figure 5D:
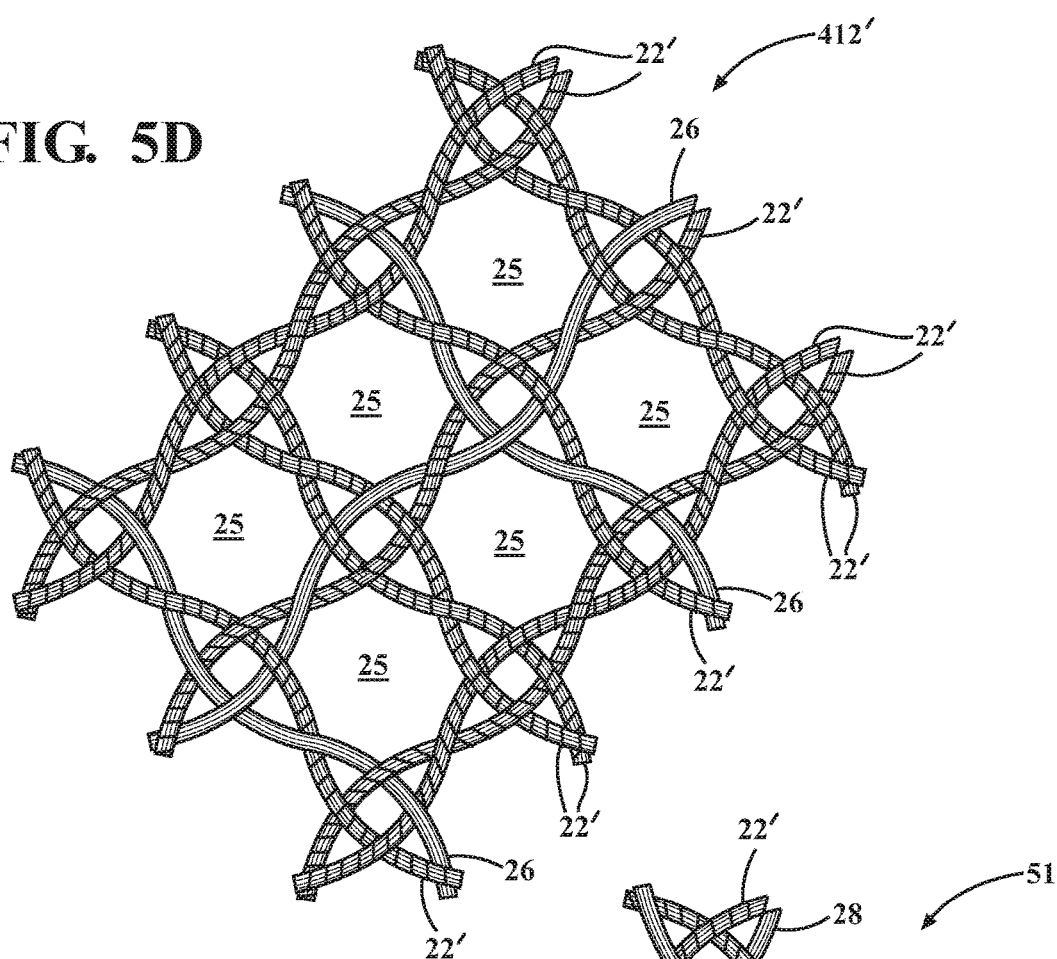
Figure 5E:
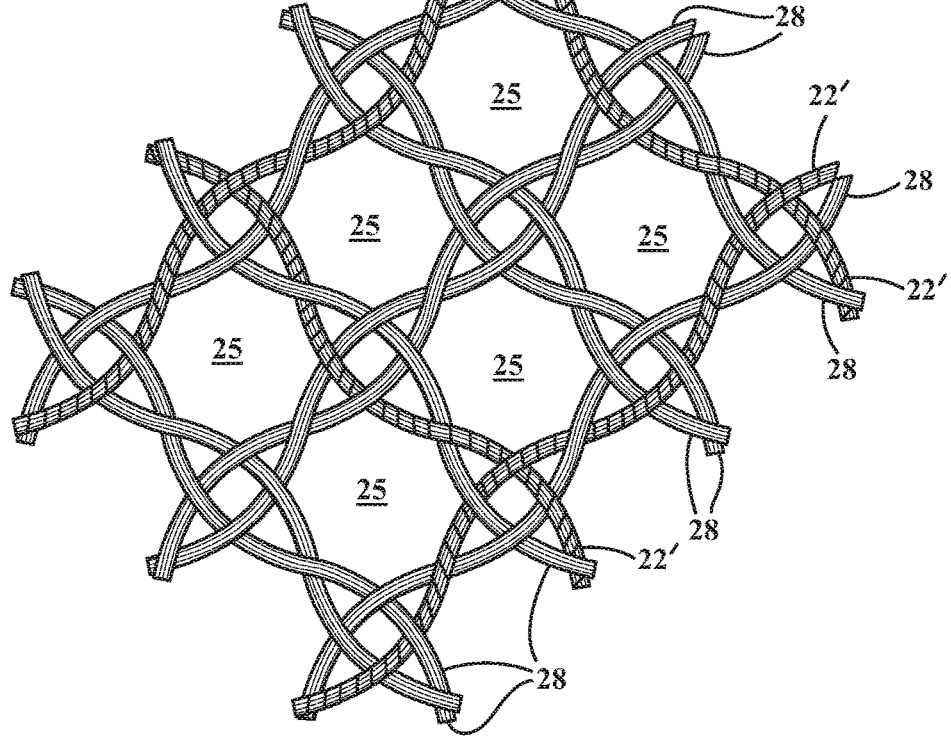
Figure 5F:
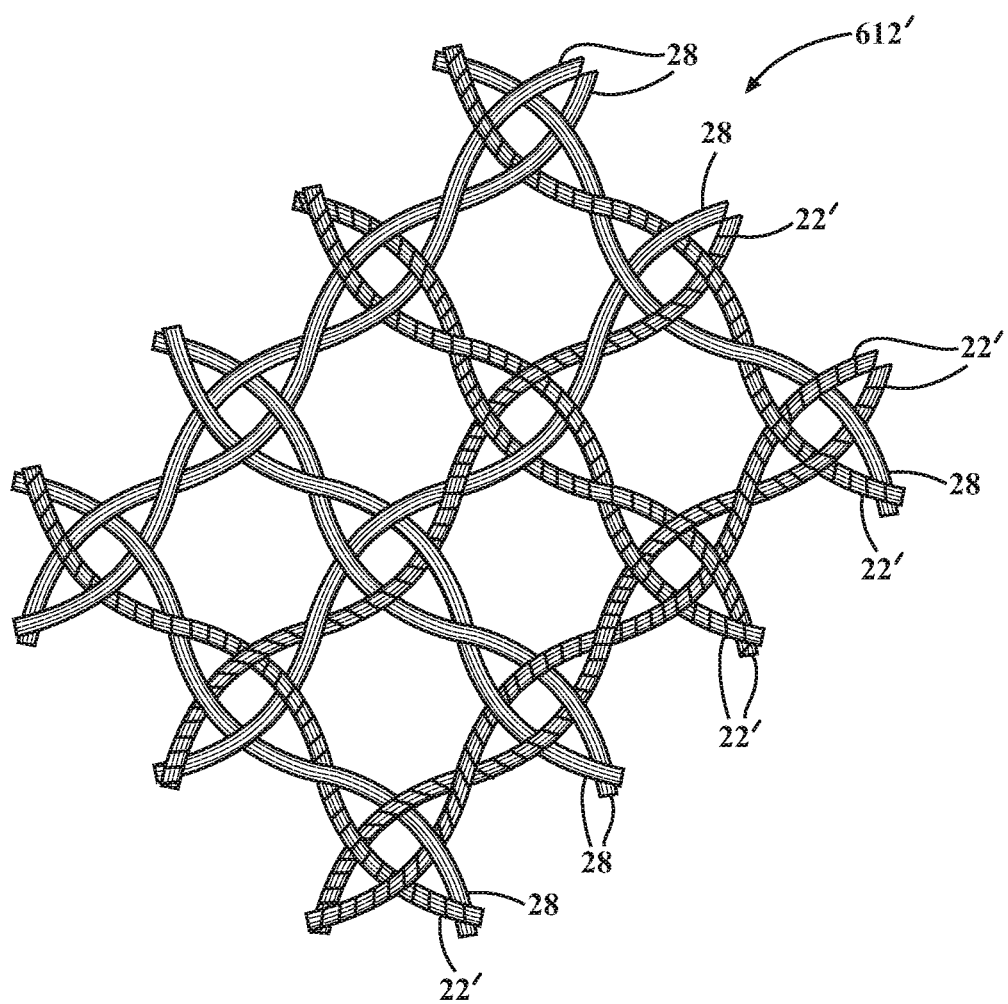

In accordance with a further aspect of the disclosure, the aforementioned walls 12, 112, 212, 312, 412, 512, 612 can be braided to include a hybrid filament 22' (FIG. 4) having at least one conductive wire filament 26 twisted or served with at least one nonconductive filament 28. For example, in non-limiting embodiments shown in FIGS. 5A-5F, the hybrid filament 22' can be used in lieu of the wire filament 26 in any of the above embodiments discussed and shown in FIGS. 3A-3F, wherein the replacement of the wire filaments 26 with the hybrid filaments 22' results in respective walls 112', 212', 312', 412', 512', 612' as illustrated, without need of further description being believed necessary, thereby providing enhanced the coverage protection against the ingress of environmental elements and enhanced impact resistance via presence of the relatively bulky, impact resistant nonconductive filaments 28 served or twisted with the wire filaments 26, particularly if the nonconductive filaments 28 are provided as multifilaments, by way of example and without limitation.

Obviously, many modifications and variations of the present invention are possible in light of the above teachings. It is contemplated that all features of all claims and of all embodiments can be combined with each other, so long as such combinations would not contradict one another. It is, therefore, to be understood that within the scope of the appended claims, the invention may be practiced otherwise than as specifically described.

What is claimed is:

1. A braided EMI protective sleeve, comprising:
   a braided, tubular wall extending lengthwise along a central longitudinal axis between open opposite ends, said wall having a plurality of filament bundles, with each filament bundle including a plurality of filaments twisted with one another to form a plurality of loops;
   a plurality of said loops of each filament bundle being interlinked with a plurality of said loops of an adjacent filament bundle; and
   a majority of said filaments being provided as conductive wire filaments to provide the sleeve with an EMI protective capability,
   wherein at least some of said filament bundles are formed entirely of nonconductive filaments twisted with one another and wherein at least some of said filament bundles include a nonconductive filament twisted with a conductive wire filament.

2. The braided EMI protective sleeve of claim 1, wherein at least some of said filament bundles are formed entirely of conductive wire filaments twisted with one another.

3. A method of constructing an EMI protective sleeve, comprising:
   braiding a tubular wall extending lengthwise along a central longitudinal axis between open opposite ends at least in part with a plurality of filament bundles, wherein each filament bundle includes a plurality of filaments twisted with one another forming loops along the length of each filament bundle;

interlinking a plurality of the loops along the length of each filament bundle with circumferentially aligned loops of an adjacent filament bundle;

providing a majority of the filaments as conductive wire filaments to provide the sleeve with an EMI protective capability;

further including providing at least some of the filament bundles including a nonconductive filament twisted with a conductive wire filament; and further including providing at least some of said filament bundles being formed entirely of conductive filaments twisted with one another.

4. The method of claim 3, further including providing at least some of the filament bundles being formed entirely of nonconductive filaments twisted with one another.

* * * * *